United States Patent
Lee et al.

(10) Patent No.: US 11,803,123 B2
(45) Date of Patent: Oct. 31, 2023

(54) PHOTOSENSITIVE RESIN COMPOSITION HAVING IMPROVED ADHESIVENESS OR ADHESION AND LIGHT BLOCKING LAYER USING SAME

(71) Applicant: DUK SAN NEOLUX CO., LTD, Cheonan-si (KR)

(72) Inventors: Myung Jun Lee, Asan-si (KR); Jun Bae, Cheonan-si (KR); Soung Yun Mun, Cheonan-si (KR)

(73) Assignee: Duk San Neolux Co., Ltd.

( * ) Notice: Subject to any disclaimer, the term of this patent is extended or adjusted under 35 U.S.C. 154(b) by 508 days.

(21) Appl. No.: 16/756,564

(22) PCT Filed: Oct. 15, 2018

(86) PCT No.: PCT/KR2018/012140
§ 371 (c)(1),
(2) Date: Apr. 16, 2020

(87) PCT Pub. No.: WO2019/078566
PCT Pub. Date: Apr. 25, 2019

(65) Prior Publication Data
US 2020/0241415 A1      Jul. 30, 2020

(30) Foreign Application Priority Data
Oct. 17, 2017    (KR) ........................ 10-2017-0134583

(51) Int. Cl.
*G03F 7/032*      (2006.01)
*C08G 59/24*      (2006.01)
(Continued)

(52) U.S. Cl.
CPC ........... *G03F 7/032* (2013.01); *C08G 59/245* (2013.01); *C09D 163/00* (2013.01);
(Continued)

(58) Field of Classification Search
CPC .............................. G03F 7/0758; G03F 7/032
See application file for complete search history.

(56) References Cited

U.S. PATENT DOCUMENTS 6,929,890 B2    8/2005   Miyoshi et al.
11,130,838 B2*   9/2021   Lee .......................... G03F 7/038
(Continued)

FOREIGN PATENT DOCUMENTS

CN      101379111 A     3/2009
CN      101616951 A    12/2009
(Continued)

OTHER PUBLICATIONS

Thiol-ene "click" reactions and recent applications in polymer and materials synthesis: a first update. A.B. Lowe, Polym. Chem., 5, 4820-4870 (2014)) (Year: 2014).*
(Continued)

*Primary Examiner* — Mark F. Huff
*Assistant Examiner* — Andrew Preston Traywick
(74) *Attorney, Agent, or Firm* — Harness, Dickey & Pierce, P.L.C.

(57) ABSTRACT

A photosensitive resin composition comprising (A) a cardo-based resin comprising a repeating unit represented by chemical formula 1 (comprising chemical formula 4); (B) a reactive unsaturated compound; (C) a pigment; (D) an initiator; and (E) a solvent, and a light blocking layer using the same having improved adhesiveness or adhesion are provided.

9 Claims, 5 Drawing Sheets

Chemical Formula (15)

(51) Int. Cl.
  G03F 7/00 (2006.01)
  G03F 7/031 (2006.01)
  C09D 163/00 (2006.01)
  *G02F 1/1335* (2006.01)
  *H10K 10/80* (2023.01)
  *H10K 30/80* (2023.01)
  *H10K 50/86* (2023.01)

(52) U.S. Cl.
  CPC ............ G03F 7/0007 (2013.01); G03F 7/031 (2013.01); *G02F 1/133512* (2013.01); *H10K 10/80* (2023.02); *H10K 30/80* (2023.02); *H10K 50/865* (2023.02)

(56) References Cited

U.S. PATENT DOCUMENTS

| | | | |
|---|---|---|---|
| 2004/0197703 A1 | 10/2004 | Miyoshi et al. | |
| 2011/0151379 A1 | 6/2011 | Choi et al. | |
| 2012/0145971 A1* | 6/2012 | Lee | G03F 7/027 252/582 |
| 2015/0111156 A1* | 4/2015 | Lee | G03F 7/0007 430/285.1 |
| 2016/0139507 A1 | 5/2016 | Kim et al. | |
| 2018/0259852 A1 | 9/2018 | Tanigaki et al. | |

FOREIGN PATENT DOCUMENTS

| | | | | |
|---|---|---|---|---|
| KR | 20040087918 A | | 10/2004 | |
| KR | 20090056014 A | * | 6/2009 | |
| KR | 20090056014 A | | 6/2009 | |
| KR | 20110008286 A | | 1/2011 | |
| KR | 20120105570 A | | 9/2012 | |
| KR | 20140146940 A | | 12/2014 | |
| KR | 20140147062 A | | 12/2014 | |
| KR | 20160056836 A | | 5/2016 | |
| KR | 20160115149 A | | 10/2016 | |
| KR | 20160035997 A | * | 10/2017 | |
| KR | 20170111133 A | * | 10/2017 | ............ G03F 7/105 |
| TW | 201730677 A | | 9/2017 | |
| WO | WO-2012091401 A2 | * | 7/2012 | |
| WO | WO-2015005546 A1 | * | 1/2015 | |
| WO | WO-2019194402 A1 | * | 10/2019 | |

OTHER PUBLICATIONS

Translation of Kim (Year: 2017).*
Translation of Choi (Year: 2009).*
Translation of Kiyoshi (Year: 2015).*
Translated Kim et al. (Year: 2017).*
International Search Report (in English and Korean) and Written Opinion of the ISA (in Korean) issued in PCT/KR2018/012140, dated Jan. 24, 2019; ISA/KR.

* cited by examiner

Chemical Formula (16)

PHOTOSENSITIVE RESIN COMPOSITION HAVING IMPROVED ADHESIVENESS OR ADHESION AND LIGHT BLOCKING LAYER USING SAME

CROSS-REFERENCE TO RELATED APPLICATIONS

This application is a U.S. National Phase Application under 35 U.S.C. 371 of International Application No. PCT/KR2018/012140, filed on Oct. 15, 2018, which claims the benefit of Korean Patent Application No. 10-2017-0134583, filed on Oct. 17, 2017 and which is hereby incorporated by reference for all purposes as if fully set forth herein. In addition, when this application claims priority in countries, other than the U.S., on the same basis, the entire content of which is hereby incorporated by reference.

TECHNICAL FIELD

The present disclosure relates to a photosensitive resin composition including a novel resin and a light blocking layer using the same.

BACKGROUND ART

A colored light-blocking layer, such as a black light-blocking layer, is used to prevent color interruption between red, green, and blue color filters in a liquid crystal display (LCD) device in order to improve image quality. Recently, in organic light-emitting displays, research into the use of colored light-blocking layers has been undertaken for the same purpose or to improve image visibility due to low reflectivity. In the manufacturing of such a light-blocking layer, carbon black and an organic pigment may be used as black colorants. The carbon black and the organic pigment are distributed when used, such that a pigment dispersion is mixed with other compositions to form patterns. Here, various types of resin, in which acrylic resins tend to have low sensitivity, heat resistance, and adhesion (or tight attachment) while having excellent shrink resistance, chemical resistance, and the like, may be used. Furthermore, in a light blocking layer in which the content of the black pigment is increased to satisfy required optical density, such decreases in sensitivity and adhesion may be more significant.

DISCLOSURE

Technical Problem

Accordingly, the present disclosure has been made in consideration of the above-described problems occurring in the related art, and the present disclosure proposes a photosensitive resin composition having excellent adhesion and resolution. Also provided is a light blocking layer manufactured from the photosensitive resin composition.

Technical Solution

According to an aspect of the present disclosure, provided is a photosensitive resin composition including at least one type of compound as represented by chemical formula 1 below, the photosensitive resin composition having improved adhesiveness and cohesion.

Chemical Formula (1)

According to another aspect of the present disclosure, provided are a photosensitive resin composition including at least one type of polymer as represented by chemical formula 1 and a light blocking layer using the same.

Advantageous Effects

The photosensitive resin composition and the light blocking layer using the same, in accordance with embodiments, have excellent pattern adhesion, process characteristics, and pattern formation.

BEST MODE

Hereinafter, reference will be made to embodiments of the present disclosure in detail with reference to the accompanying drawings.

In designating elements of the drawings by reference numerals, the same elements will be designated by the same reference numerals although they are shown in different drawings. Further, in the following description of the present disclosure, a detailed description of known functions and configurations incorporated herein will be omitted in the situation in which the subject matter of the present disclosure may be rendered rather unclear thereby.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element. When an element, such as a layer, a film, an area, or a substrate or plate, is referred to as being "on" or "above" another element, it should be understood that the element is on/above the other element directly or via an "intervening" element. In contrast, when an element is referred to as being "directly on/above" another element, it should be understood that there are no intervening elements between the elements.

As used in the specification and the appended claims, the following terms have the following meanings unless stated otherwise.

The term "halo" or "halogen" as used herein includes fluorine (F), chlorine (Cl), bromine (Br), and iodine (I).

The term "alkyl" as used herein refers to a radical of a saturated aliphatic functional group, including straight chain alkyl groups, branched chain alkyl groups, cycloalkyl (alicyclic) groups, alkyl-substituted cycloalkyl groups, or cycloalkyl-substituted alkyl groups, having 1 to 60 carbon atoms joined by one or more single bonds.

Unless stated otherwise, the term "halo-alkyl" or "halogen alkyl" as used herein refers to a halogen-substituted alkyl group.

The term "alkenyl" or "alkynyl" as used herein refers to, but is not limited to, a group having double or triple bonds, with a carbon number ranging from 2 to 60, including straight chain groups or branched chain groups.

Unless stated otherwise, the term "cycloalkyl" refers to, but is not limited to, an alkyl forming a ring having a carbon number ranging from 3 to 60.

The term "alkoxy group" or "alkyloxy group" as used herein refers to an alkyl group having an oxygen radical attached thereto. Unless stated otherwise, the "alkoxy group" or "alkyloxy group" has a carbon number ranging from 1 to 60, but is not limited thereto.

The term "alkenoxyl group", "alkeneoxy group", "alkenyloxyl group", or "alkenyloxy group" as used herein refers to an alkenyl group having an oxygen radical attached thereto. Unless stated otherwise, the "alkenoxyl group", "alkeneoxy group", "alkenyloxyl group", or "alkenyloxy group" has a carbon number ranging from 2 to 60, but is not limited thereto.

Unless stated otherwise, the term "aryl group" or "arylene group" as used herein has a carbon number ranging from 6 to 60, but is not limited thereto. Herein, the aryl group or the arylene group includes monocyclic compounds, ring assemblies, fused polycyclic systems, or compounds. For example, the aryl group may refer to a phenyl group, a monovalent functional group of biphenyl, a monovalent functional group of naphthalene, a fluorenyl group, or a substituted fluorenyl group.

In addition, herein, fluorene may be regarded as an aryl group having a carbon number of 13, or may be regarded as a compound in which two methyl groups substituted on a biphenyl group are bonded to share a single carbon atom to form a ring.

Unless stated otherwise, the term "fluorenyl group" or "fluorenylene group" as used herein refers to a monovalent or divalent functional group of fluorene. The term "substituted fluorenyl group" or "substituted fluorenylene group" as used herein refers to a monovalent or divalent functional group of substituted fluorene. The term "substituted fluorene" refers to a compound in which at least one of the following substituents R, R', R", and R'" is a functional group other than hydrogen. The substituted fluorene includes a case in which R and R' are bonded to form a spiro compound together with carbon atoms attached thereto.

In addition, R, R', R", and R'" may independently be an alkyl group having a carbon number ranging from 1 to 20, an alkenyl group having a carbon number ranging from 1 to 20, an aryl group having a carbon number ranging from 6 to 30, or a heterocyclic group having a carbon number ranging from to 3 to 30. For example, the aryl group may be phenyl, naphthalene, anthracene, or phenanthrene. The heterocyclic group may be pyrrole, furan, thiophene, pyrazole, imidazole, triazole, pyridine, pyrimidine, pyridazine, pyrazine, triazine, indole, benzofuran, quinazoline or quinoxaline. For example, each of the substituted fluorenyl group and the substituted fluorenylene group may be a monovalent or divalent functional group of 9,9-dimethylfluorene, 9,9-diphenylfluorene, or 9,9'-spirobi[9H-fluorene].

The term "ring assembly" as used herein refers to a compound in which two or more rings (single rings or fused ring systems) are joined directly by single or double bonds and in which the number of such direct ring junctions is one less than a total number of the ring systems in the compound. In such ring assemblies, the same or different ring systems may be joined directly by single or double bonds.

Herein, the aryl group includes the ring assembly. Thus, the aryl group includes biphenyl and terphenyl in which benzene rings, i.e. mono-aromatic rings, are joined by single bonds. In addition, since the aryl group includes compounds in which mono-aromatic rings and a fused aromatic ring system are joined by single bonds, the aryl group includes compounds in which a benzene ring, i.e. a mono-aromatic ring, and a fused aromatic ring system are joined by a single bond to form a conjugated pi electron system.

The term "fused polycyclic system" as used herein is a form of fused rings sharing at least two atoms. The fused polycyclic system includes a form in which two or more hydrocarbon ring systems are fused, a form including at least one fused hetero ring system including at least one heteroatom, and the like. The fused polycyclic system may be an aromatic ring, a heteroaromatic ring, an aliphatic ring, or a combination thereof.

The term "spiro compound" as used herein has "a spiro union", which refers to a union of two rings sharing only one atom. In this case, the atom shared by the two rings is referred to as a "spiro atom". Such compounds are referred to as, for example, "monospiro-", "dispiro-", and "trispiro-" compounds depending on the number of spiro atoms included in the compounds.

The term "heterocyclic group" as used herein includes not only aromatic rings, such as "heteroaryl groups" or "heteroarylene groups", but also non-aromatic rings. Unless stated otherwise, the heterocyclic group refers to, but not limited to, rings including one or more heteroatoms with a carbon number ranging from 2 to 60. The term "heteroatom" as used herein indicates N, O, S, P, or Si unless stated otherwise. The "heterocyclic group" refers to monocyclic compounds, ring assemblies, fused polycyclic systems, spiro compounds, or the like.

In addition, the "heterocyclic group" may include rings having $SO_2$ in place of a ring-forming carbon atom. For example, the "heterocyclic group" includes the following compound:

The term "ring" as used herein refers to monocyclic rings and polycyclic rings, includes not only hydrocarbon rings but also hetero rings including at least one heteroatom, and includes aromatic rings and non-aromatic rings.

The term "polycyclic ring" as used herein includes ring assemblies, such as biphenyl or terphenyl, fused polycyclic systems, and Spiro compounds. The polycyclic ring includes not only aromatic compounds but also non-aromatic compounds, and includes not only hydrocarbon rings but also hetero rings including at least one heteroatom.

In addition, in a case in which prefixes are named subsequently, substituents are listed in the order of the prefixes. For example, an aryl alkoxy group refers to an alkoxy group substituted with an aryl group, and an alkoxy carbonyl group refers to a carbonyl group substituted with an alkoxy group. In addition, an aryl carbonyl alkenyl group refers to an alkenyl group substituted with an arylcarbonyl group, with the arylcarbonyl group being a carbonyl group substituted with an aryl group.

Unless stated otherwise, the term "substituted" in the term "substituted or non-substituted" as used herein refers to substitution with one or more substituents selected from the group consisting of, but not limited to, heavy hydrogen, a halogen, an amino group, a nitrile group, a nitro group, a $C_1$-$C_{20}$ alkyl groups, a $C_1$-$C_{23}$ alkoxy group, a $C_1$-$C_{20}$ alkyl amine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynil group, a $C_3$-$C_{20}$ cycloalkyl group, a $C_6$-$C_{20}$ aryl group, a $C_6$-$C_{20}$ aryl group substituted with heavy hydrogen, a $C_8$-$C_{20}$ arylalkenyl group, a silane group, a boron group, a germanium group, and $C_2$-$C_{20}$ heterocyclic group including at least one heteroatom selected from the group consisting of O, N, S, Si, and P.

In the present specification, "the name of a functional group" corresponding to an aryl group, an arylene group, a heterocyclic group, or the like exemplified as each symbol and a substituent thereof may be written in the name of the functional group on which the valence thereof is reflected, or may be written in the name of the parent compound thereof. For example, phenanthrene, i.e. a type of aryl group, may be written in group names by distinguishing the valence. That is, a monovalent phenanthrene "group" may be written as "phenanthryl (group)," while a divalent phenanthrene "group" may be written as "phenanthrylene (group)." In contrast, phenanthrene groups may be written as "phenanthrene", i.e. the name of the functional group, regardless of the valence. Similarly, pyrimidine may be written as "pyrimidine" regardless of the valence. Alternatively, pyrimidine may be written in the group names of corresponding valences, so that a monovalent pyrimidine group is written as pyrimidinyl (group) and a divalent pyrimidine group is written as pyrimidinylen (group). Accordingly, in a case in which the type of a substituent is written in the name of the parent compound in the present specification, the written name may refer to an n-valence "group" formed by the desorption of a carbon atom and/or a hydrogen atom bonded to a heteroatom.

In addition, unless stated otherwise, chemical formulas used herein are applied in the same manner as the definition of the substituent on the basis of the exponential definition of the following chemical formula:

where, if a is 0, substituent $R^1$ is absent. If a is 1, a single substituent $R^1$ is attached to any one of the carbon atoms of the benzene ring. If a is 2 or 3, the substituent $R^1$ is attached in the following manner, where $R^1$ may be the same or different. If a is an integer between 4 and 6, the substituent $R^1$ is attached to a carbon atom of the benzene ring in a similar manner. Here, the illustration of hydrogen atoms attached to carbon atoms of the benzene ring will be omitted.

Hereinafter, embodiments of the present disclosure will be described in detail. It should be understood, however, that the embodiments are provided for illustrative purposes only, and the present disclosure is not limited to these embodiments. The scope of the present disclosure shall be defined by the appended Claims.

A photosensitive resin composition according to an embodiment of the present disclosure includes (A) a cardo-based resin including a repeating unit as represented in chemical formula 1 below, (B) a reactive unsaturated compound, (C) a pigment, (D) an initiator, and (E) solvent. The resin having the structure as represented in chemical formula 1 includes a substituent as represented by chemical formula 4 below. Specifically, each of $Y_1$ and $Y_2$ is at least one portion of the resin having the structure as represented in chemical formula 1. Both or one of $Y_1$ and $Y_2$ may include the substituent represented by chemical formula 4 below to improve adhesion (adhesiveness) to a backing. Accordingly, to an electronic device including the photosensitive resin composition according to the present disclosure may have excellent resolution.

Hereinafter, individual components of the photosensitive resin composition according to embodiments of the present disclosure will be described in detail.

(A) Patterning Resin

A patterning resin according to an embodiment of the present disclosure includes a repetitive structure as represented in chemical formula 1:

In chemical formula 1 and chemical formula 2,

"*" indicates a portion in which bonds are linked by repeating units.

$R_1$ to $R^6$ are independently the same as or different from each other. Each of $R^1$ to $R^6$ is one selected from the group consisting of hydrogen, heavy hydrogen, and a substituted or non-substituted $C_1$-$C_{20}$ alkyl group.

$R^7$ is one selected from the group consisting of hydrogen, heavy hydrogen, a substituted or non-substituted $C_1$-$C_{20}$ alkyl group, a substituted or non-substituted $C_2$-$C_{20}$ alkenyl group, an acrylic group, and a meta-acryl group.

Each of m and n is an integer selected from among 0 to 4.

$X_1$ is one selected from the group consisting of a single bond, O, CO, $SO_2$, CR'R", SiR'R", and compounds represented by chemical formula 2.

(Here, R' and R" are independently the same as or different from each other. Each of R' and R" is one selected from the group consisting of hydrogen, and a substituted or non-substituted $C_1$-$C_{20}$ alkyl group).

$X_2$ is one selected from the group consisting of acid anhydride residues and acid dianhydride residues. In other embodiments, $X_2$ is one selected from the group consisting of $C_6$-$C_{20}$ aryl group; $C_1$-$C_{10}$ alkyl group; $C_1$-$C_{10}$ alkoxy group; and $C_2$-$C_{20}$ heterocyclic group including at least one heteroatom selected from the group consisting of O, N, S, Si, and P. In other embodiments, $X_2$ is biphenyl

$R^8$ and $R^9$ are independently the same as or different from each other. Each of $R^8$ and $R^9$ is one selected from the group consisting of hydrogen, heavy hydrogen, a substituted or non-substituted $C_1$-$C_{20}$ alkyl group, a substituted or non-substituted $C_1$-$C_{20}$ alkoxy group, and a substituted or non-substituted $C_2$-$C_{20}$ alkenyl group.

Each of o and p is one integer selected from among 0 to 4.

$Y_1$ and $Y_2$ are independently the same as or different from each other. Each of $Y_1$ and $Y_2$ is one selected from the group consisting of hydrogen, heavy hydrogen, chemical formula 3, and chemical formula 4. At least one of $Y_1$ and $Y_2$, each of which is at least a portion of the repeating unit of chemical formula 1, is shown in chemical formula 4 below.

In chemical formula 3 and chemical formula 4, $L_1$ to $L_3$ are independently the same as or different from each other. Each of $L_1$ to $L_3$ is one selected from the group consisting of a single bond, a substituted or non-substituted $C_1$-$C_{20}$ alkylene group, and a substituted or non-substituted $C_6$-$C_{30}$ arylene group.

$R_{10}$ to $R_{14}$ are independently the same as or different from each other. Each of $R_{10}$ to $R_{14}$ is one selected from the group consisting of hydrogen, heavy hydrogen, a $C_1$-$C_{20}$ alkyl group, and a $C_1$-$C_{20}$ alkoxy group.

$Z_1$ is S.

Each of q and r is an integer selected from among 0 to 3, where q+r=3.

Here, each of the halogen group, the alkyl group, the alkenyl group, the acrylic group, the metha-acrylic group (methacrylic group), the alkoxy group, the alkylene group, and the arylene group may be further substituted with at least one selected from the group consisting of heavy hydrogen, a halogen, a silane group, a siloxane group, a boron group, cyano group, a $C_1$-$C_{20}$ alkylthio group, a $C_1$-$C_{20}$ alkoxy group, a $C_1$-$C_{20}$ alkyl group, a $C_2$-$C_{20}$ alkenyl group, a $C_2$-$C_{20}$ alkynil group, a $C_6$-$C_{20}$ aryl group, a $C_6$-$C_{23}$ aryl group substituted with heavy hydrogen, a $C_2$-$C_{20}$ heterocyclic group, a $C_3$-$C_{20}$ cycloalkyl group, a $C_7$-$C_{20}$ aryl alkyl group, a $C_8$-$C_{20}$ arylalkenyl group, a carbonyl group, an ether group, a $C_2$-$C_{20}$ alkoxylcarbonyl group, and a $C_6$-$C_{30}$ aryloxy group.

Here, in the aryl group, the carbon number may range from 6 to 60, preferably, 6 to 40, and more preferably, 6 to 30. In the heterocyclic group, the carbon number may range from 2 to 60, preferably, 2 to 30, and more preferably, 2 to 20. In the alkyl group, the carbon number may range from 1 to 50, preferably, 1 to 30, more preferably, 1 to 20, and further more preferably, 1 to 10.

Specifically, the aryl group or the arylene group may independently be a phenyl group, a biphenyl group, a terphenyl group, a naphthyl group, a phenanthryl group or phenylene group, a biphenylene group, a terphenylene group, a naphthylene group or phenanthrylene group, or the like.

In addition, the resin according to the present disclosure may have a weight-average molecular weight ranging from 1,000 g/mol to 100,000 g/mol, preferably, 1,000 g/mol to 50,000 g/mol, and more preferably, 1,000 g/mol to 30,000 g/mol.

In a case in which the weight-average molecular weight of the resin is within the above range, when a light blocking layer is manufactured, the pattern formation may be facilitated, with no loss in the thickness of a film occurring during development, thereby producing a fine pattern. The resin may be included in the photosensitive resin composition in a content ranging from 1 to 30 weight percent (wt %), more preferably, 3 wt % to 20 wt % of a total amount of the photosensitive resin composition. In a case in which the resin is included in this range, excellent sensitivity, image developing ability, adhesion, and adhesion may be obtained.

The photosensitive resin composition may further include an acrylic resin in addition to the above-described resin. The acrylic resin is a copolymer of a first ethylenically unsaturated monomer and a second ethylenically unsaturated monomer copolymerizable with the first ethylenically unsaturated monomer. The acrylic resin includes one or more acrylic repeating units.

(B) Reactive Unsaturated Compound

The reactive unsaturated compound is a monomer or an oligomer generally used in the photosensitive resin composition. The reactive unsaturated compound used may be monofunctional or multifunctional esters of (meth)acrylic acid having at least one ethylenically unsaturated double bond. Due to the ethylenically unsaturated double bond, the reactive unsaturated compound may sufficiently perform polymerization during exposure, thereby forming a pattern having excellent heat resistance, light resistance, and chemical resistance. Specific examples of the reactive unsaturated compound may include ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenol A epoxy acrylate, ethylene glycol monomethyl ether acrylate, trimethylolpropane triacrylate, tris-acryloyloxyethyl phosphate, and the like.

Examples of commercially available products of the photopolymerizable monomer may be as follows. Examples of the monofunctional esters of (meth)acrylic acid may include Aronix M-101, M-111, and M-114 available from Toagosei Chemical Industry Co., Ltd.; KAYARAD TC-110S® and TC-120S available from Nippon Kayaku Co., Ltd.; V-158 and V-2311 available from Osaka Organic Chemical Industry Co., Ltd.; and the like. Examples of the difunctional esters of (meth)acrylic acid may include Aronix M-210, M-240, M-6200, and the like available from Toagosei Chemical Industry Co., Ltd.; KAYARAD HDDA, HX-220, R-604, and the like available from Nippon Kayaku Co., Ltd.; and V-260, V-312, V-335 HP, and the like available from Osaka Organic Chemical Industry Co., Ltd. Examples of the trifunctional esters of (meth)acrylic acid may include Aronix M-309, M-400, M-405, M-450, M-7100, M-8030, M-8060, and the like available from Toagosei Chemical Industry Co., Ltd.; KAYARAD TMPTA, DPCA-20, DPCA-60, DPCA-120, and the like available from Nippon Kayaku Co., Ltd.; and V-295, V-300, V-360, and the like available from Osaka Organic Chemical Industry Co., Ltd. The above-mentioned products may be used alone or in a combination of at least two thereof. The reactive unsaturated compound may be treated with acid anhydride to have more excellent image developing ability before being used.

The reactive unsaturated compound may be included in the photosensitive resin composition in a content ranging from 1 wt % to 40 wt %, e.g., 1 wt % to 20 wt % of a total amount of the photosensitive resin composition. In a case in which the reactive unsaturated compound is included in this range, excellent reliability is obtained due to sufficient curing during exposure in a pattern forming process, and the pattern has excellent heat resistance, light resistance, and chemical resistance as well as excellent resolution and adhesion.

(C) Pigment

The pigment may be implemented as either an organic pigment or an inorganic pigment. The pigment may be implemented as a red pigment, a green pigment, a blue pigment, a yellow pigment, a black pigment, or the like.

Examples of the red pigment may include C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment may be halogen-substituted copper phthalocyanine pigments, such as C.I. green pigment 36 and C.I. green pigment 7. Examples of the blue pigment may be copper phthalocyanine pigments, such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, and C.I. blue pigment 16. Examples of the yellow pigment may be isoindoline-based pigments, such as C.I. yellow pigment 139, quinophthalone-based pigments, such as C.I. yellow pigment 138, nickel complex pigments, such as C.I. yellow pigment 150, and the like. Examples of the black pigment may be lactam black, anilin black, perylene black, titanium black, carbon black, and the like.

The above-mentioned pigments may be used alone or as a combination of at least two thereof. However, the present disclosure is not limited to these examples. Among the above-mentioned pigments, the black pigment may be used to improve the light-blocking efficiency of the light blocking layer. In a case in which the black pigment is used, the black pigment may be used together with a color corrector, such as an anthraquinone-based pigment, a perylene-based pigment, a phthalocyanine-based pigment, and an azo-based pigment. In the photosensitive resin composition, a dispersant may be used together to disperse the pigment. Specifically, a surface treatment may be performed with the dispersant before the use of the pigment, or the dispersant may be added together with the pigment in the manufacturing of the photosensitive resin composition. The dispersant may be implemented as a non-ionic dispersant, an anionic dispersant, a cationic dispersant, or the like. Specific examples of the dispersant may include polyalkylene glycol, polyalkylene glycol esters, polyoxyalkylene, polyhydric alcohol ester alkylene oxide adducts, alcoholalkylene oxide adducts, sulfonic acid esters, sulfonic acid salts, carboxylic acid esters, carboxylic acid salts, alkylamide alkylene oxide adduct, alkyl amines, and the like. Such dispersants may be used alone or in a mixture of at least two thereof.

Examples of commercially available dispersant products may include, but are not limited to, DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like available from BYK; EFKA-47, EFKA-47EA, EFKA-48, EFKA-49, EFKA-100, EFKA-400, and EFKA-450 available from BASF; Solsperse 5000, Solsperse 12000, Solsperse 13240, Solsperse 13940, Solsperse 17000, and Solsperse 20000 available from Zeneka; and PB711, PB821, and the like available from Ajinomoto. The dispersant may be included in the photosensitive resin composition in a content ranging from 0.1 wt % to 15 wt %. In a case in which the dispersant is included in this range, excellent dispersibility of the photosensitive resin composition results in excellent reliability, image developing ability, and pattern characteristics in the manufacturing of the light blocking layer.

The pigment may be used after being pretreated with a water soluble inorganic salt and a wetting agent. In a case in which the pigment is used after being pretreated, the primary grain diameter of the pigment may be reduced. The pretreatment may be performed by a step of kneading the pigment together with a water soluble and a wetting agent and a step of filtering and water cleaning the pigment produced in the kneading step. The kneading may be performed in a temperature ranging from 40° C. to 100° C. In the filtering and water cleaning, the filtering may be performed after the inorganic salt is cleaned with water.

Although examples of the water soluble inorganic salt may include, but are not limited to, sodium chloride, potassium chloride, and the like. The wetting agent serves as a medium allowing the pigment and the water soluble inorganic salt to be uniformly mixed therein so that the pigment is easily crushed. Examples of the wetting agent may include alkylene glycol mono-alkyl ethers, such as ethylene glycol mono-ethyl ether, propylene glycol mono-methyl ether, and diethylene glycol mono-methyl ether; alcohols, such as ethanol, isopropanol, butanol, hexanol, cyclohexanol, ethylene glycol, diethylene glycol, polyethylene glycol, and glycerin polyethylene glycol; and the like. These examples may be used alone or in a combination of at least two thereof.

After the kneading step, the pigment may have an average grain diameter ranging from 20 nm to 110 nm. In a case in which the average grain diameter of the pigment is in this range, a fine pattern having excellent heat resistance and light resistance may be effectively formed. The pigment may be included in the photosensitive resin composition in a content ranging from 1 wt % to 40 wt %, more particularly, 2 wt % to 30 wt % of a total amount of the photosensitive resin composition. In a case in which the pigment is included in this range, color reproducibility is excellent, and the curing ability and adhesion of the pattern are excellent.

(D) Initiator

The initiator may be implemented as a photopolymerization initiator, a radical polymerization initiator, or a combination thereof.

The photopolymerization initiator is an initiator generally used in the photosensitive resin composition. For example, the photopolymerization initiator may be implemented as an acetophenone-based compound, a benzophenone-based compound, a thioxanthone-based compound, a benzoin-based compound, an oxime ester-based compound, a triazine-based compound, or the like. Examples of the acetophenone-based compound may include 2,2'-diethoxyacetophenone, 2,2'-dibutoxyacetophenone, 2-hydroxy-2-methylpropiophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like. Examples of the benzophenone-based compound may include benzophenone, benzoyl benzoic acid, benzoyl benzoic acid methyl, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxy benzophenone, and the like. Examples of the thioxanthone-based compound may include thioxanthone, 2-chrolthioxanthone, 2-methylthioxanthone, isopropyl thioxanthone, 2,4-diethyl thioxanthone, 2,4-diisopropyl thioxanthone, 2-chloro thioxanthone, and the like. Examples of the benzoin-based compound may include benzoin, benzoin methyl ether, benzoin ethyl ether, benzoin isopropyl ether, benzoin isobutyl ether, benzyldimethyl ketal, and the like. Examples of the triazine-based compound may include 2,4,6-trichloro-s-triazine, 2-phenyl 4,6-bis(trichloromethyl)-s-triazine, 2-(3',4'-dimethoxy styryl)-4,6-bis(trichloromethyl)-s-triazine, 2-(4'-methoxy naphthyl)-4,6-bis(trichloromethyl)-s-triazine, 2-(p-methoxy phenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-il)-4,6-bis (trichloromethyl)-s-triazine, 2-(4-methoxy naphthol-il)-4,6-s(trichloromethyl)-s-triazine, 2-4-tri chloromethyl (piperonyl)-6-triazine, 2-4-trichloromethyl(4'-methoxy styryl)-6-triazine, and the like.

The photopolymerization initiator may also be implemented as a carbazole-based compound, a deketone-type compound, a sulfonium borate-based compound, a diazo-based compound, an imidazole-based compound, or a biimidazole-based compound, in addition to the above-mentioned compounds. The radical polymerization initiator may be implemented as a peroxide-based compound, an azobis-based compound, or the like.

Examples of the peroxide-based compound may include ketone peroxides, such as methyl ethyl ketone peroxide, methyl isobutyl ketone peroxide, cyclohexanone peroxide, methylcyclohexanone peroxide, and acetylacetone peroxide; diacyl peroxides, such as isobutyryl peroxide, 2,4-dichloro benzoyl peroxide, o-methylbenzoyl peroxide, and bis-3,5,5-trimethylhexanoyl peroxide; hydroperoxides, such as 2,4,4,-trimethylpentyl-2-hydroperoxide, diisopropyl benzene hydroperoxide, cumene hydroperoxide, and t-butylhydroperoxide; dialkyl peroxides, such as dicumyl peroxide, 2,5-dimethyl-2,5-di(t-butyl peroxy)hexane, 1,3-bis(t-butyloxy-isopropyl)benzene, and t-butyl peroxyvaleric acid n-butylester; alkyl peresters, such as 2,4,4-trimethylpentyl peroxyphenoxy acetate, α-cumyl peroxyneodecanoate, t-butyl peroxybenzoate, and di-t-butyl peroxytrimethyl adipate; percarbonates, such as di-3-methoxy butyl peroxydicarbonate, di-2-ethylhexyl peroxydicarbonate, bis-4-t-butylcyclohexyl peroxydicarbonate, diisopropyl peroxydicarbonate, acetyl cyclohexyl sulfonyl peroxide, and t-butyl peroxyaryl carbonate; and the like.

Examples of the azobis-based compound may include 1,1'-azobiscyclohexane-1-carbonitrile, 2,2'-azobis(2,4-dimethylvaleronitrile), 2,2,-azobis(methyl isobutyrate), 2,2'-azobis(4-methoxy-2,4-dimethylvaleronitrile), α,α'-azobis (isobutylnitryl), 4,4'-azobis(4-cyano valeric acid), and the like. The initiator may be used together with a photosensitizer that is converted to an excited state by light absorbed thereby and then transfers the energy, thereby causing a chemical reaction. Examples of the photosensitizer may include tetraethylene glycol bis-3-mercaptopropionic acid, pentaerythritol tetrakis-3-mercaptopropionic acid, dipentaerythritol tetrakis-3-mercaptopropionic acid, and the like.

The initiator may be included in the photosensitive resin composition in a content ranging from 0.01 wt % to 10 wt %, e.g. 0.1 wt % to 5 wt %, of a total amount of the photosensitive resin composition. In a case in which the initiator is included in this range, excellent reliability may be obtained due to sufficient curing during exposure in the pattern forming process, and the pattern may have excellent heat resistance, light resistance, and chemical resistance as well as excellent resolution and adhesion, thereby preventing the transmittance from being reduced by the unreacted initiator.

(E) Solvent

The solvent may be implemented as any material that has compatibility but does not react with the cardo-based resin, the reactive unsaturated compound, the pigment, and the initiator described above.

Examples of the solvent may include alcohols, such as methanol and ethanol; ethers, such as dichloroethyl ether, n-butyl ether, diisoamyl ether, methylphenyl ether, and tetrahydrofuran; glycol ethers, such as ethylene glycol monomethyl ether, and ethylene glycol mono-ethyl ether; cellosolve acetates, such as methyl cellosolve acetate, ethyl cellosolve acetate, and diethyl cellosolve acetate; carbitols, such as methyl ethyl carbitol, diethyl carbitol, diethylene glycol mono-methyl ether, diethylene glycol mono-ethyl ether, diethylene glycol dimethylether, diethylene glycol methyl ethyl ether, and diethylene glycol diethyl ether; propylene glycol alkylether acetates, such as propylene glycol methyl ether acetate and propylene glycol propylether acetate; aromatic hydrocarbons, such as toluene and xylene; ketones, such as methyl ethyl ketone, cyclohexanone, 4-hydroxy-4-methyl-2-pentanone, methyl-n-propyl ketone, methyl-n-butyl kenon, methyl-n-amyl ketone, and 2-heptanone; saturated aliphatic mono-carboxylic acid alkyl esters, such as acetate acid ethyl, acetate acid-n-butyl, and acetate acid isobutyl; lactic esters, such as lactic methyl and lactic ethyl; oxy acetate acid alkyl esters, such as oxy acetate acid methyl, oxy acetate acid ethyl, and oxy acetate acid butyl; alkoxy acetate acid alkyl esters, such as methoxy acetate acid methyl, methoxy acetate acid ethyl, methoxy acetate acid butyl, ethoxy acetate acid methyl, and ethoxy acetate acid ethyl; 3-oxy propionic acid alkyl esters, such as 3-oxy propionic acid methyl and 3-oxy propionic acid ethyl; 3-alkoxy propionic acid alkyl esters, such as 3-methoxy propionic acid methyl, 3-methoxy propionic acid ethyl, 3-ethoxy propionic acid ethyl, and 3-ethoxy propionic acid methyl; 2-oxy propionic acid alkyl esters, such as 2-oxy propionic acid methyl, 2-oxy propionic acid ethyl, and 2-oxy propionic acid propyl; 2-alkoxy propionic acid alkyl esters, such as 2-methoxy propionic acid methyl, 2-methoxy propionic acid ethyl, 2-ethoxy propionic acid ethyl, and 2-ethoxy propionic acid methyl; mono-oxy mono-carboxylic acidalkyl esters including 2-oxy-2-methyl propionic acid esters, such as 2-oxy-2-methyl propionic acid methyl, 2-oxy-2-methyl propionic acid ethyl, and 2-alkoxy-2-methyl propionic acid alkyls, such as 2-methoxy-2-methyl propionic acid methyl, 2-ethoxy-2-methyl propionic acid ethyl; esters, such as 2-hydroxy propionic acid ethyl, 2-hydroxy-2-methyl propionic acid ethyl, hydroxyl acetic acid ethyl, and 2-hydroxy-3-methyl butanoic acid; keto acid esters, such as ethyl pyruvate. In addition, examples of the solvent may also include high boiling point solvents, such as N-methylformamide, N,N-dimethylformamide, N-methylformanilade, N-methyl-acetamide, N,N-dimethyl-acetamide, N-methylpyrrolidone, dimethyl sulfoxide, benzylethyl ether, dehexylether, acetylacetone, isophorone capronic acid, acprylic acid, 1-octanol, 1-nonano, benzylalcohol, acetate benzyl, benzoic acid ethyl, oxalic acid diethyl, maleic acid diethyl, γ-butyrolactone, carbonic acid ethylene, carbonic acid propylene, and phenyl cellosolve acetate.

In consideration of compatibility and reactibility, glycol ethers, such as ethylene glycol mono-ethyl ether; ethylene glycol alkylether acetates, such as ethyl cellosolve acetate; esters, such as 2-hydroxy propionic acid ethyl; carbitols, such as diethylene glycol mono-methyl ether; and propylene glycol alkylether acetates, such as propylene glycol methyl ether acetate, propylene glycol propylether acetate, may be used.

The solvent may be included in the photosensitive resin composition as the balance of the total amount of photosensitive resin composition. Specifically, the solvent may be included in a content ranging from 50 wt % to 90 wt %. In a case in which the solvent is included in this range, the photosensitive resin composition has a suitable degree of viscosity, so that excellent processability is obtained in the manufacturing of the light blocking layer.

That is, the photosensitive resin composition according to the present embodiment may include: (A) the resin represented by chemical formula 1, in a content of from 1 wt % to 30 wt %; (B) the reactive unsaturated compound in a content of 1 wt % to 40 wt %; (C) the pigment in a content of 1 wt % to 30 wt %; (D) the initiator in a content of 0.01 wt % to 10 wt %; and (E) the balance of the solvent.

Another embodiment of the present disclosure provides a light blocking layer (or light shield layer) manufactured from the above-described photosensitive resin composition. Specifically, the light blocking layer may refer to the state of a pattern manufactured by forming a layer by applying the photosensitive resin composition, followed by exposure to light, image development, and post-treatment. In addition, the light blocking layer according to the present disclosure also includes a state in which the photosensitive resin composition produced by drying the photosensitive resin composition is photo-cured or thermally cured.

The application method of the photosensitive resin composition is not specifically limited, but may be implemented as spraying, roll coating, rotary application or coating, slit coating, extrusion coating, curtain coating, die coating, wire bar coating, knife coating, or the like. The drying of the photosensitive resin composition may be performed, for example, at a temperature of from 60° C. to 100° C. for 30 seconds to 15 minutes, although the drying may vary depending on the constituent components, the type and content of the organic solvent, and the like. However, these are for illustrative purposes only, and the drying conditions of the photosensitive resin composition according to the present disclosure are not limited thereto.

Here, the light blocking layer may be used as one of a color filter for a display panel, a colored light blocking layer for a display panel, a base film of a substrate for a display device, an insulating layer of a substrate for a display device, an interlayer insulating film for a display panel, a pixel defined film or a bank layer for a display panel, a solder resist for a display panel, a black matrix for a display panel, a passivation film (or protective film) for a circuit board, a base film of a circuit board, an insulating layer of a circuit board, and an interlayer insulating film or a solder resist for semiconductor.

According to another embodiment of the present disclosure, an electronic device including a liquid crystal display (LCD) device including the above-described light blocking layer or a display device including the above-described light blocking layer and an organic electronic device is provided. The electronic device further includes a controller driving the display device. The light blocking layer will be exemplified as being used as the colored light blocking layer or the black light blocking layer to prevent color interference among the red, green, and blue filters in the electronic device in order to improve image quality, the light blocking layer, but is not limited thereto.

In addition, the light blocking layer used as a pixel defined film for a display panel refers to the light blocking layer or a product of the light blocking layer, e.g. a light blocking layer product, a photoreactive material, or the like laminated on a substrate.

A photosensitive film may be formed by pre-laminating the light blocking layer on an intended surface of a display panel at a temperature of from 20° C. to 50° C. by flat pressing or roll pressing and then performing vacuum lamination at a temperature of from 60° C. to 90° C.

In addition, a pattern may be fabricated in the light blocking layer by exposing the light blocking layer to light using a photomask in order to provide microscopic structures or fine width lines. The amount of light exposure may be properly adjusted depending on the type of a light source and the thickness of the film, which are used in ultraviolet (UV) exposure. For example, the amount of light exposure may be in, but is not limited to, the range from 100 to 1200 m/cm², and more particularly, 100 to 500 m/cm².

Available active rays may include electron beams, UV radiation, X-rays, and the like. Preferably, UV radiation may be used. In addition, available light sources may include a high-pressure mercury lamp, a low-pressure mercury lamp, a halogen lamp, and the like.

After the exposure, the spraying is used in the image development. The photosensitive resin composition develops an image due to the use of an alkaline water solution, such as a sodium carbonate water solution, and then, is cleaned with water. Afterwards, when a heat treatment causes polyamic acid to be converted to polyimide depending on the pattern obtained by the development, a heat treatment temperature required for imidization may range from 100° C. to 250° C. Here, it may be effective to increase the heat treatment temperature in 2 to 4 stages with an appropriate temperature profile. In some cases, curing may be performed at a predetermined temperature. A pixel defined film for a display panel or the like may be produced by the above-described steps.

In addition, an organic electronic device according to the present disclosure may be an organic light-emitting diode (OLED) device (or organic electroluminescent device), an organic photovoltaic cell, an organic photo conductor (OPC), an organic transistor (or organic TFT), or a monochromatic or white illumination device.

The organic electronic device according to the present disclosure may be categorized into front-lit, rear-lit, or both-side lit electronic devices depending on the material used.

A white organic light-emitting device (WOLED) facilitates the realization of high resolution and has excellent processability while being able to be advantageously fabricated using existing color filter technology of LCDs. A variety of structures for the WOLED typically used as a backlight device has been proposed and patented. Typically, such structures include a solution of arranging red (R), green (G), and blue (B) light-emitting structures on a plane (side-by-side solution); a solution of stacking R, G, and B light-emitting layers are stacked in a top-bottom direction (stacking solution); and a solution in which electroluminescence of a blue (B) organic light-emitting layer and photo-luminescence of an inorganic phosphor generated using light generated by the electroluminescence are used (color conversion material (CCM) solution). The present disclosure may also be applicable to the WOLED.

Another embodiment of the present disclosure may provide an electronic device including a display device including the above-described organic electronic device according to the present disclosure and a controller controlling the display device. Here, the electronic device may be a present or future wired/wireless communication terminal, and refers to any type of electronic device, such as a mobile communication terminal (e.g. a mobile phone), a personal digital assistance (PDA), an electronic dictionary, a portable media player (PMP), a remote control, a navigation device, a game player, a variety of televisions (TVs), a variety of computers.

Hereinafter, the compounds included in the photosensitive resin composition according to exemplary embodiments of the present disclosure will be described in detail by way of examples. However, the following examples are merely exemplary embodiments of the present disclosure, and the present disclosure is not limited to the following examples.

PREPARATIONS

Preparation 1: Preparation of
9,9-Bis[4-(glycidyloxy)phenyl] fluorine According
to Chemical Formula 5 (Compound 1)

20 g of 9,9'-bisphenolfluorene (available from Sigma Aldrich), 8.67 g of glycidyl chloride available from Sigma Aldrich), and 30 g of anhydrous potassium carbonate were input to a 300 ml 3-neck round bottom flask, with dimethylformamide 100 ml and a distillation tube being accommodated in the flask, and then temperature was raised to 80° C., allowing a reaction to occur for 4 hours. Thereafter, the temperature was lowered to 25° C., the reaction solution was filtered, and the filtered solution 1000 ml was added dropwise to water while being stirred. The precipitated powder was filtered, cleaned with water, and then depressurized and dried. Consequently, 25 g of 9,9-Bis[4-(glycidyloxy)phenyl] fluorine according to chemical formula 5 was prepared. The precipitated powder exhibited 98% purity as a result of high-performance liquid chromatography (HPLC) purity analysis.

Chemical Formula (5)

Preparation 2: Preparation of Cardo Binder Resin According to Chemical Formula 6 (Compound 2)

25 g (54 mmol) of compound 1 produced in Preparation 1, 8 g of acrylic acid (available from Daejung Chemicals & Metals), 0.2 g of benzyltriethylammonium chloride (available from Daejung Chemicals & Metals), and 0.2 g of hydroquinone (available from Daejung Chemicals & Metals) were input to a 300 ml 3-neck round bottom flask, with 52 g of Propylene glycol methyl ether acetate (Available from Sigma Aldrich) and a distillation tube being accommodated in the flask, and the compounds were stirred at 110° C. for 6 hours. After the reaction was completed, 8 g of biphenyltetracarboxylic acid dianhydride (available from (Mitsubishi Gas) and 1.8 g of tetrahydrophthalic acid (Available from Sigma Aldrich) were added, followed by stirring at 110° C. for 6 hours. After the reaction was completed, the reaction solution was collected and analyzed. As a result of the analysis, a cardo binder resin having a molecular weight 4,500, a structure as represented in chemical formula 6, and a solid content of 45% was prepared.

surized distillation was performed, thereby preparing 23 g of 6-(Trimethoxy silyl)-1-hexanethiol according to chemical formula 8 (compound 4).

Chemical Formula (7)

Chemical Formula (8)

Chemical Formula (6)

Preparation 3: Preparation of 6-(rimethoxy silyl)-1-hexanethiol According to Chemical Formula 8 (Compound 4)

In a 3-neck round bottom flask in which a distillation tube connected to a cooling water source is accommodated, 20 g (0.147 mol) of trichloro silane (available from Gelest) and 17.51 g (0.147 mol) of 6-chloro-1-hexene (available from Aldrich) were dissolved. 0.02 g of a platinum(0)-1,3-divinyl-1,1,3,3-tetramethyldisiloxane complex solution (2 wt % in xylene; available from Aldrich) was input to the flask. A reaction was performed for 5 hours by raising a temperature to 75° C. while inputting nitrogen to the flask. Afterwards, catalyst was removed by filtering the resultant solution using a membrane made of 0.1 μm Teflon.

Thereafter, methanol 15.6 g (0.487 mol) was added dropwise at room temperature for 30 minutes, and then, an additional reaction was performed for 2 hours by raising the temperature to 50° C. Afterwards, the solvent was removed by depressurizing and distilling the reaction solution. 24 g (0.1 mol) of 6-chlorohexyltrimethoxy silane according to the above-produced chemical formula 7 (compound 3), 8 g (0.15 mol) sodium methoxide (available from Aldrich), 187 ml (0.15 mol) of a hydrogen sulfide THF solution (0.8 M concentration), and methanol 100 ml were input to an autoclave, and a reaction was performed at 100° C. for 2 hours. After the reaction solution was cooled, 100 ml of hydrogen chloride in methanol (1.25M concentration) was added dropwise at room temperature for 30 minutes, a produced salt was filtered and removed, and then depres-

Preparation 4: Preparation of 9-(trimethoxy silyl)-1-nonanethiol According to Chemical Formula 9 (Compound 5)

The processing was performed in the same manner as in Preparation 3, except that 23.7 (0.147 mol) of 9-Chloro-1-nonene (available from AK Scientific) was used in place of 6-chloro-1-hexene.

Chemical Formula (9)

Preparation 5: Preparation of 12-(Trimethoxy silyl)-1-dodecanethiol According to Chemical Formula 10 (Compound 6)

The processing was performed in the same manner as in Preparation 3, except that 30 g (0.147 mol) of 12-Chloro-1-dodecene (available from Atomax Chemicals) was used in place of 6-chloro-1-hexene.

Chemical Formula (10)

Preparation 6: Preparation of 6-(triethoxysilyl)-1-hexanethiol According to Chemical Formula 11 (Compound 7)

The processing was performed in the same manner as in Preparation 3, except that 22.4 g (0.487 mol) of ethanol (available from Aldrich) was used in place of methanol input after the removal of platinum.

Chemical Formula (11)

Preparation 7: Preparation of 6-(tributhoxysilyl)-1-hexanethiol According to Chemical Formula 12 (Compound 8)

The processing was performed in the same manner as in Preparation 3, except that 36 g (0.487 mol) of 1-butanol (available from Aldrich) was used in place of methanol input after the removal of platinum.

Chemical Formula (12)

Preparation 8: Preparation of 6-(dimethoxy methylsilyl)-1-hexanethiol According to Chemical Formula 13 (Compound 9)

The processing was performed in the same manner as in Preparation 3, except that 18 g (0.147 mol) of dichloromethylsilane was used in place of trichlorosilane.

Chemical Formula (13)

Chemical Formula (13)

Preparation 9: Preparation of Cardo Binder Resin According to Chemical Formula 15 (Compound 11)

6.36 g (34 mmol) of KBM 803 (3-(Trimethoxy silyl)-1-propanethiol (available from Shinetsu), corresponding to chemical formula 14 (compound 10), was input to a solution of compound 2 obtained in Preparation 2, followed by a temperature rise to 60° C. and stirring for 4 hours, so that a silane group-substituted cardo binder resin corresponding to chemical formula 15 (compound 11) was prepared.

Chemical Formula (14)

Figure 3:
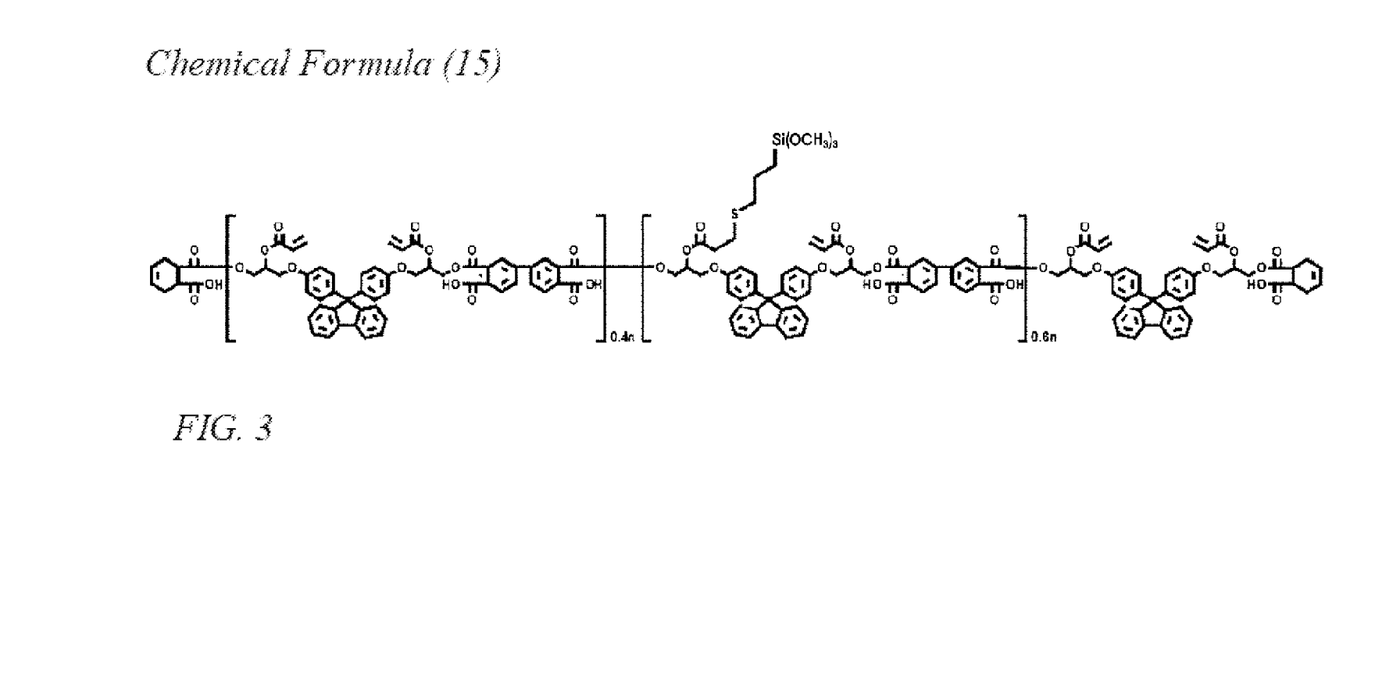
FIG. 3 shows Chemical Formula (15)

Chemical Formula (15) (please see FIG. 3)

Preparation 10: Preparation of Cardo Binder According to Chemical Formula 16 (Compound 12)

8.1 g (34 mmol) of 6-(Trimethoxy silyl)-1-hexanethiol (compound 4), corresponding to chemical formula 8, was input to a cardo binder solution (compound 2) produced in Preparation 2, followed by a temperature rise to 60° C. and stirring for 4 hours, so that a silane-substituted cardo binder resin corresponding to chemical formula 16 was prepared.

Figure 4:
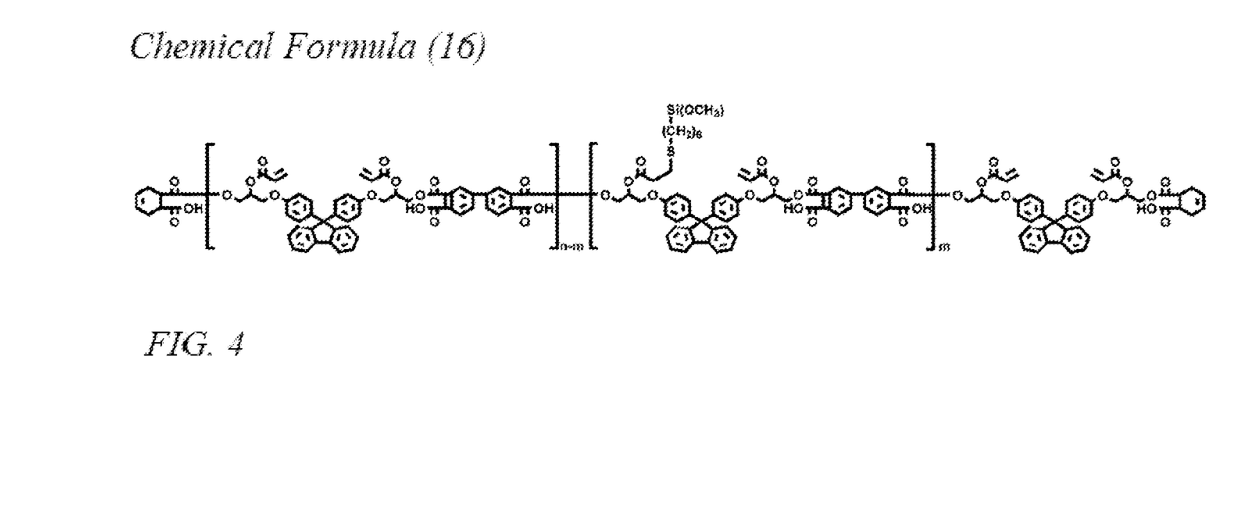
FIG. 4 shows Chemical Formula 16.

Chemical Formula (16) (please see FIG. 4)

Preparation 11: Preparation of Cardo Binder According to Chemical Formula 17 (Compound 13)

9.53 g (34 mmol) of 6-(triethoxysilyl)-1-hexanethiol (compound 7), corresponding to chemical formula 11, was input to a cardo binder solution (compound 2) produced in Preparation 2, followed by a temperature rise to 60° C. and stirring for 4 hours, so that a silane-substituted cardo binder resin corresponding to chemical formula 17 was prepared.

Figure 5:
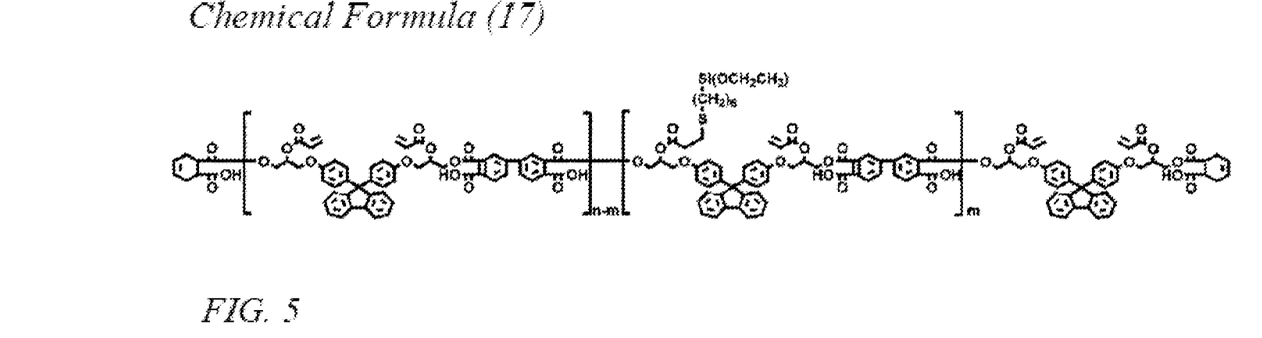
FIG. 5 shows Chemical Formula 17.

Chemical Formula (17) (please see FIG. 5)

Preparation 12: Preparation of Black Pigment Dispersion 15 g of black pigment (available from BASF), 8.5 g of disperbyk 163, 5.5 g of KBR-101, 71 g of propylene glycol methyl ether acetate, and 100 g of zirconia beads (available from Toray) having a diameter of 0.5 mm were dispersed for 10 hours using a paint shaker (available from Asada), thereby preparing a dispersion.

Analysis of Preparation of Photosensitive Resin Composition

Examples 1 to 3 and Comparative Examples 1 to 2 were manufactured with compositions as shown in following Table 1.

TABLE 1

|  | Ex. 1 | Ex. 2 | Ex. 3 | Comp. Ex. 1 | Comp. Ex. 2 |
|---|---|---|---|---|---|
| Black pigment dispersion of Preparation 4 | 40 | 40 | 40 | 40 | 40 |
| Miraemer M600 (Miwon Specialty Chemical) | 3.5 | 3.5 | 3.5 | 3.5 | 3.5 |
| OXE-02 (BASF) | 0.5 | 0.5 | 0.5 | 0.5 | 0.5 |
| Compound 2 of Preparation 2 |  |  |  | 9 |  |
| Compound 10 of Preparation 9 | 9 |  |  |  |  |
| Compound 10 of Preparation 11 |  | 9 |  |  |  |
| Compound 11 of Preparation 12 |  |  | 9 |  |  |
| NPR-8000 (Miwon Commercial) |  |  |  |  | 9 |
| Propylene glycol methyl ether acetate | 47 | 47 | 47 | 47 | 47 |

A method of manufacturing a light blocking layer from the above composition is as follows.

(1) Application and Coating Step

The above-described black photosensitive resin composition was applied on a cleaned glass substrate having a 10 cm×10 cm area to a thickness 1.5 µm using a spin coater, and then, a solvent was removed by heating at 100° C. for 1 minute, thereby forming a film.

(2) Exposure Step

The resultant film was irradiated with radiation, e.g. actinic rays, ranging from 190 nm to 500 nm to form an intended pattern, with a mask having a predetermined shape placed on the film. An MA-6 exposure machine (available from SUSS) was used, and the amount of exposure was 100 mJ/cm².

(3) Development Step

After the exposure step, image development was performed in an AX 300 MIF developing solution available from AZEM at 25° C. for 1 minute by a dipping method, and then, non-exposed portions were dissolved and removed by water cleaning, so that only the exposed portions remained to develop an image pattern.

(4) Post-Treatment Step

The image pattern obtained by the development was subjected to post-baking in an oven at 230° C. for 30 minutes in order to impart the pattern with excellent characteristics in relation to heat resistance, light resistance, adhesion, crack resistance, chemical resistance, high strength, storage reliability, and the like.

Figure 1:
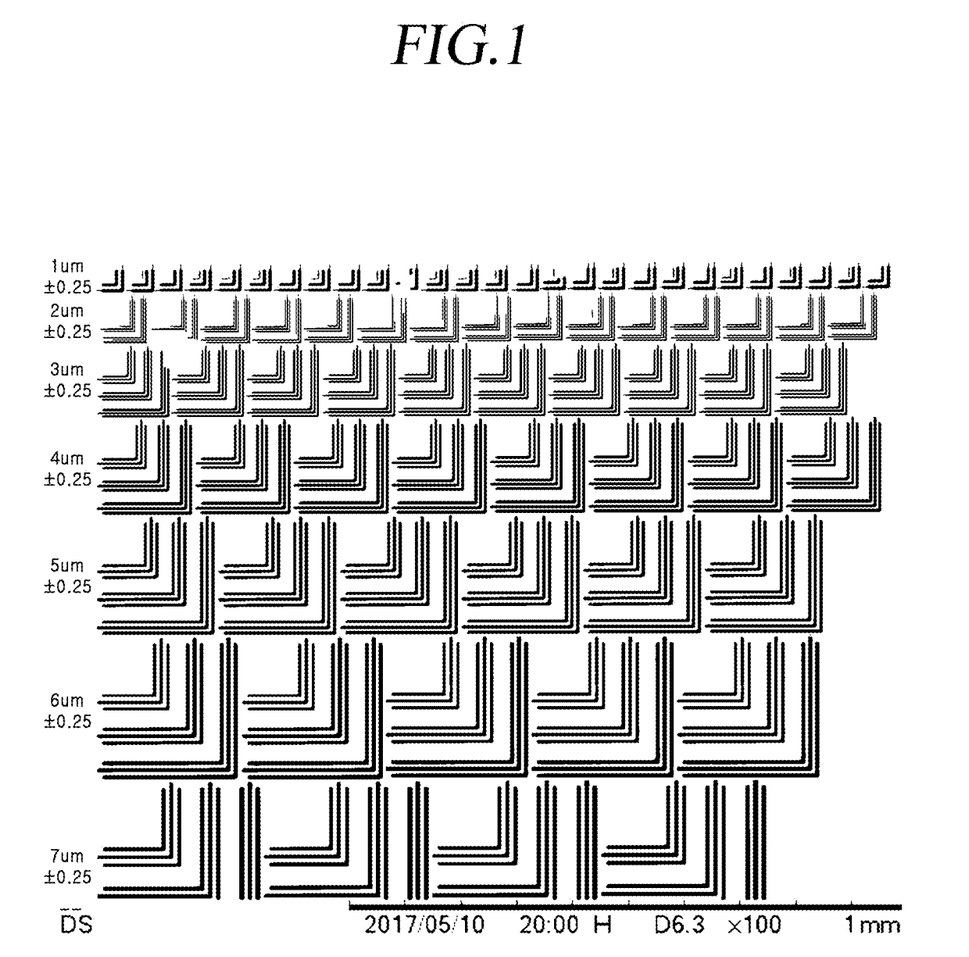
FIG. 1 is an image of a pattern manufactured from a photosensitive resin composition according to embodiments.
Figure 2:
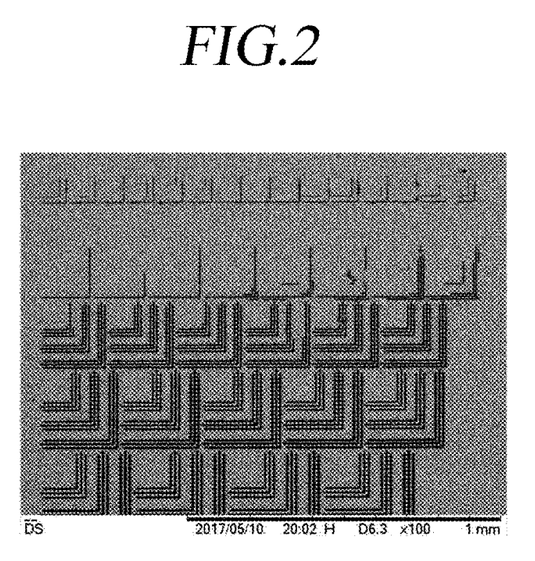
FIG. 2 is an image of a pattern manufactured from a photosensitive resin composition according to a comparative example.

Regarding the patterns produced by the above-described steps, the minimum sizes of the patterns attached to backings were compared using SEM (available from Jeol) and are represented in Table 2. Pattern images according to Examples and Comparative Examples are illustrated in FIGS. 1 and 2.

TABLE 2

|  | Ex. 1 | Ex. 2 | Ex. 3 | Comp. Ex. 1 | Comp. Ex. 2 |
|---|---|---|---|---|---|
| Minimum Size Pattern (µm) on Backing | 3 | 4 | 4 | 6 | 18 |

CROSS-REFERENCE TO RELATED APPLICATION

This application claims priority under 35 U.S.C § 119(a) from Korean Patent Application No. 10-2017-0134583, filed on Oct. 17, 2017, which is hereby incorporated by reference for all purposes as if fully set forth herein. In addition, when this application claims priority in countries, other than the U.S., on the same basis, the entire content of which is hereby incorporated by reference.

The invention claimed is:

1. A photosensitive resin composition comprising:
(A) a resin including a repeating unit represented in chemical formula 1 below, wherein each of $Y_1$ and $Y_2$ is at least one portion of the repeating unit, and both or one of the $Y_1$ and the $Y_2$ includes following chemical formula 4;
(B) reactive unsaturated compound;
(C) pigment;
(D) initiator; and
(E) solvent, wherein, in the chemical formula 1 and the chemical formula 2,
"*" indicates a portion in which bonds are linked by repeating units,
$R_1$ to $R_6$ are independently equal to or different from each other, wherein each of the $R_1$ to the $R_6$ is one selected from a group consisting of hydrogen, heavy hydrogen, and a substituted or non-substituted $C_1$-$C_{20}$ alkyl group, $R_7$ is one selected from a group consisting of hydrogen, heavy hydrogen, a substituted or non-substituted $C_1$-$C_{20}$ alkyl group, a substituted or non-substituted $C_2$-$C_{20}$ alkenyl group, an acrylic group, and a meta-acryl group, each of m and n is an integer selected from among 0 to 4, $X_1$ is one selected from a group consisting of a single bond, O, CO, $SO_2$, CR'R'', SiR'R'', and compounds represented by chemical formula 2, where R' and R'' are independently equal to or different from each other, wherein each of the R' and the R'' is one selected from a group consisting of hydrogen, and a substituted or non-substituted $C_1$-$C_{20}$ alkyl group, $X_2$ is one selected from a group consisting of acid anhydride residues and acid dianhydride residues, $R_8$ and $R_9$ are independently equal to or different from each other, wherein each of the $R_8$ and the $R_9$ is one selected from a group consisting of hydrogen, heavy hydrogen, a substituted or non-substituted $C_1$-$C_{20}$ alkyl group, a substituted or non-substituted $C_1$-$C_{20}$ alkoxy group, and a substituted or non-substituted $C_2$-$C_{20}$ alkenyl group, each of o and p is one integer selected from among 0 to 4, and $Y_1$ and $Y_2$ are independently equal to or different from each other, wherein each of the $Y_1$ and the $Y_2$ is one selected from a group consisting of hydrogen, heavy hydrogen, chemical formula 3, and chemical formula 4, and wherein at least one of the $Y_1$ and the $Y_2$, each of which is at least a portion of the repeating unit of the chemical formula 1, is shown in chemical formula 4 below, wherein, in the chemical formula 3 and the chemical formula 4, $L_1$ to $L_3$ are independently equal to or different from each other, wherein each of the $L_1$ to the $L_3$ is one selected from the group consisting of a single bond, a substituted or non-substituted $C_1$-$C_{20}$ alkylene group, and a substituted or non-substituted $C_6$-$C_{30}$ arylene group, $R_{10}$ to $R_{14}$ are independently equal to or different from each other, wherein each of $R_{10}$ to $R_{14}$ is one selected from the group consisting of hydrogen, heavy hydrogen, a $C_1$-$C_{20}$ alkyl group, and a $C_1$-$C_{20}$ alkoxy group, $Z_1$ is S, each of q and the r is an integer selected from among 0 to 3, with q+r=3, where each of the halogen group, the alkyl group, the alkenyl group, the acrylic group, the metha-acrylic group (methacrylic group), the alkoxy group, the alkylene group, and the arylene group is further substitutable with at least one selected from the group consisting of heavy hydrogen, a halogen, a silane group, a siloxane group, a boron group, cyano group, a $C_1$-$C_{20}$ alkylthio group, a $C_1$-$C_{20}$ alkoxyl group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with heavy hydrogen, a $C_2$-$C_{20}$ heterocyclic group, a $C_3$-$C_{20}$ cycloalkyl group, a $C_7$-$C_{20}$ aryl alkyl group, a $C_8$-$C_{20}$ arylalkenyl group, a carbonyl group, an ether group, a $C_2$-$C_{20}$ alkoxylcarbonyl group, and a $C_6$-$C_{30}$ aryloxy group.

2. The photosensitive resin composition according to claim 1, wherein the weight-average molecular weight of the resin ranges from 1,000 g/mol to 100,000 g/mol.

3. The photosensitive resin composition according to claim 1, wherein the photosensitive resin composition comprises:

the resin including the chemical formula 1 in an amount of 1 wt % to 30 wt %;

the reactive unsaturated compound in an amount of 1 wt % to 40 wt %;

the pigment in an amount of 1 wt % to 30 wt %;

the initiator in an amount of 0.01 wt % to 10 wt %; and the balance of the solvent.

4. The photosensitive resin composition according to claim 1, wherein the initiator includes a photopolymerization initiator, a radical polymerization initiator, or a combination thereof.

5. A light blocking layer comprising the photosensitive resin composition as claimed in claim 1.

6. The light blocking layer according to claim 5, wherein the light blocking layer is used as one of a color filter for a display panel, a colored light blocking layer for a display panel, a base film of a substrate for a display device, an insulating layer of a substrate for a display device, an interlayer insulating film for a display panel, a pixel defined film or a bank layer for a display panel, a solder resist for a display panel, a black matrix for a display panel, a passivation film for a circuit board, a base film of a circuit board, an insulating layer of a circuit board, and an interlayer insulating film or a solder resist for semiconductor.

7. An electronic device comprising:

a display device including the light blocking layer as claimed in claim 6; and a controller driving the display device.

8. The electronic device according to claim 7, wherein the electronic device comprises a liquid crystal display device or an organic electronic device.

9. The electronic device according to claim 8, wherein the organic electronic device is an organic light-emitting diode device, an organic photovoltaic cell, an organic photo conductor, an organic transistor, or a monochromatic or white illumination device.

* * * * *